United States Patent
Ferreira et al.

(10) Patent No.: US 10,621,292 B2
(45) Date of Patent: Apr. 14, 2020

(54) METHOD, APPARATUS AND COMPUTER PROGRAM PRODUCT PROVIDING SIMULATOR FOR ENHANCED OIL RECOVERY BASED ON MICRON AND SUBMICRON SCALE FLUID-SOLID INTERACTIONS

(71) Applicant: International Business Machines Corporation, Armonk, NY (US)

(72) Inventors: Rodrigo Neumann Barros Ferreira, Rio de Janeiro (BR); Mathias B. Steiner, Rio de Janeiro (BR)

(73) Assignee: International Business Machines Corporation, Armonk, NY (US)

( * ) Notice: Subject to any disclaimer, the term of this patent is extended or adjusted under 35 U.S.C. 154(b) by 675 days.

(21) Appl. No.: 15/131,064

(22) Filed: Apr. 18, 2016

(65) Prior Publication Data

US 2017/0298714 A1    Oct. 19, 2017

(51) Int. Cl.
G06F 17/50        (2006.01)
E21B 43/16        (2006.01)
G05D 16/00        (2006.01)

(52) U.S. Cl.
CPC .......... *G06F 17/5009* (2013.01); *E21B 43/16* (2013.01); *G05D 16/00* (2013.01)

(58) Field of Classification Search
None
See application file for complete search history.

(56) References Cited

U.S. PATENT DOCUMENTS

| | | | |
|---|---|---|---|
| 8,081,802 B2 | 12/2011 | Dvorkin et al. | |
| 8,155,377 B2 | 4/2012 | Dvorkin et al. | |
| 8,583,410 B2 * | 11/2013 | Sisk | G01N 33/24 702/6 |
| 8,725,477 B2 | 5/2014 | Zhang et al. | |

(Continued)

OTHER PUBLICATIONS

D. Koroteev, O. Dinariev, N. Evseev, D. Klemin, S. Safonov, O. Gurpinar, Schulumberger, S. Berg, C. VanKruijsdijk, M. Myers, L. Hathon, H. de Jong, R. Armstrong, "Application of Digital Rock Technology for Chemical EOR Screening" SPE, pp. 1-12, 2013.*

(Continued)

*Primary Examiner* — Kibrom K Gebresilassie
(74) *Attorney, Agent, or Firm* — Harrington & Smith

(57) ABSTRACT

A method includes constructing a digital model of a porous rock sample using input data and establishing for the digital model of a porous rock sample and for a fluid of interest figures-of-merit that are established for full-sample dimensions. For a selected fluid flow model, the method performs a calibration so as to match parameters of the selected fluid flow model to the established figures-of-merit and, based on the calibrated fluid flow model, performs at least one simulation of a flow of the fluid through the digital model of a porous rock sample with a fluid additive to provide a predicted enhanced fluid recovery efficiency. Also disclosed is a system as well as a computer program product configured to implement the method.

20 Claims, 4 Drawing Sheets

(56) References Cited

U.S. PATENT DOCUMENTS

| | | | |
|---|---|---|---|
| 8,908,925 B2 | 12/2014 | Hurley et al. | |
| 9,134,457 B2* | 9/2015 | Hurley | G01V 99/005 |
| 9,927,554 B2* | 3/2018 | Andersen | E21B 49/02 |
| 2009/0271233 A1* | 10/2009 | Prange | E21B 47/00 706/46 |
| 2010/0299123 A1* | 11/2010 | Ounaissa | E21B 43/30 703/10 |
| 2011/0015912 A1* | 1/2011 | Oppert | G01V 99/00 703/10 |
| 2011/0131020 A1* | 6/2011 | Meng | G01V 1/303 703/2 |
| 2011/0288842 A1* | 11/2011 | Gutierrez Ruiz | E21B 43/00 703/10 |
| 2011/0295580 A1* | 12/2011 | Sisk | G01N 33/24 703/10 |
| 2012/0029895 A1* | 2/2012 | Xi | G01V 99/005 703/10 |
| 2012/0203525 A1* | 8/2012 | Rodriguez Herrera | E21B 47/022 703/2 |
| 2012/0221306 A1 | 8/2012 | Hurley et al. | |
| 2013/0179080 A1* | 7/2013 | Skalinski | G01V 99/00 702/7 |
| 2013/0308837 A1 | 11/2013 | Dvorkin et al. | |
| 2013/0338976 A1 | 12/2013 | De Prisco et al. | |
| 2014/0019054 A1 | 1/2014 | De Prisco et al. | |
| 2014/0044315 A1 | 2/2014 | Derzhi et al. | |
| 2014/0058676 A1 | 2/2014 | De Prisco et al. | |
| 2014/0136158 A1* | 5/2014 | Hegazy | E21B 43/26 703/2 |
| 2015/0066465 A1* | 3/2015 | Deschamps | G01V 99/005 703/10 |
| 2015/0338550 A1* | 11/2015 | Wadsley | E21B 43/00 703/2 |
| 2015/0363520 A1* | 12/2015 | Bailey | E21B 49/00 703/10 |
| 2016/0063150 A1* | 3/2016 | Safonov | E21B 43/16 703/10 |
| 2016/0187532 A1* | 6/2016 | Hurley | E21B 49/02 702/12 |
| 2016/0194940 A1* | 7/2016 | Andersen | E21B 43/00 703/2 |
| 2016/0306074 A1* | 10/2016 | Andersen | E21B 43/00 |
| 2016/0319640 A1* | 11/2016 | Ratulowski | E21B 49/00 |
| 2017/0032532 A1* | 2/2017 | Andersen | E21B 49/02 |
| 2017/0277812 A1* | 9/2017 | Holland | G06F 17/5009 |
| 2018/0058211 A1* | 3/2018 | Liang | G01V 11/00 |
| 2018/0253514 A1* | 9/2018 | Bryant | G06F 17/5009 |

OTHER PUBLICATIONS

Koroteev et al., "Application of Digital Rock Technology for Chemical EOR Screening", SPE 165258, 2013 Society of Petroleum Engineers, prepared for presentation at SPE Enhanced Oil Recovery Conference held in Kual Lumpur, Malaysia Jul. 2-4, 2013.

Daian et al., "3D Reconstitution of Porous Media from Image Processing Data using a Multicase Percolation System", Journal of Petroleum Science and Engineering, Oct. 16, 2003.

Fernandes et al., "Multiscale Geometrical Reconstruction of Porous Structures", Physical Review E, vol. 54, No. 2, Aug. 1996.

Liang et al., "A Reconstruction Technique for Three-Dimensional Porous Media Using Image Analysis and Fourier Transforms", Journal of Petroleum Science and Engineering, Jul. 21, 1998 pp. 273-283.

Huang et al, "Proposed Approximation for Contact Angles in Shan-and-Chen-type Multicomponent Multiphase Lattice Boltzmann Models", Physical Review E 76, 2007.

Schmieschek et al., "Contact Angle Determination in Multicomponent Lattice Boltzmann Simulations", Commun. Comput. Phys. vol. 9, No. 5, pp. 1165-1178, May 2011.

Tartakovsky et al., "Modeling of Surface Tension and Contact Angles with Smoothed Particle Hydrodynamics", Physical Review E 72, 026301, 2005.

Das et al., "Equilibrium Shape and Contact Angle of Sessile Drops of Different Volumes—Computation by SPH and its Further Improvement by D1", Chemical Engineering Science, 2010, pp. 4027-4037.

Liu et all, "Modeling of Contact Angles and Wetting Effects with Particle Methods", International Journal of Computational Methods, vol. 9, No. 4 (2011), 637-651.

Henrich et al., "An Adhesive DPD Wall Model for Dynamic Wetting", A Letters Journal Exploring the Frontiers of Physics, Dec. 2007.

Lin et al., "Surface Wettability and Contact Angle Analysis by Dissipative Particle Dynamics", Interaction and Multiscale Mechanics, vol. 5, No. 4 (2012) p. 399-405.

http://www.fei.com/software/avizo-3d-for-digital-rock-and-core-analysis/Avizo 3D Software for Core Sample and Digital Rock Anaylsis; downloaded Apr. 11, 2016.

https://en.wikipedia.org/wili/Tomography downloaded Apr. 11, 2016.

Rocketh Group, http://www.rockphysics.ethz.ch/ Imperial College Department of Earth Science and Engineering.

Digital Rocks Portal https://www.digitalrocksportal.org/ University of Texas.

* cited by examiner

METHOD, APPARATUS AND COMPUTER PROGRAM PRODUCT PROVIDING SIMULATOR FOR ENHANCED OIL RECOVERY BASED ON MICRON AND SUBMICRON SCALE FLUID-SOLID INTERACTIONS

TECHNICAL FIELD

The exemplary embodiments of this invention relate generally to simulation methods, computer programs and apparatus and, more specifically, to methods, programs and data processing systems configured to simulate physical interactions between a fluid and a mineral matrix, such as between oil and rock.

BACKGROUND

Fluid-fluid and fluid-solid interactions in digital rock analysis (DRA) can be modeled in order to better predict enhanced oil recovery (EOR) efficiency and to support decision-making in oil recovery operations. One type of decision that can be made relates to selection of an additive to aid in the recovery of oil from a particular reservoir.

SUMMARY

In a first aspect thereof the embodiments of this invention provide a method that comprises constructing a digital model of a porous rock sample using input data; establishing for the digital model of a porous rock sample and for a fluid of interest figures-of-merit that are established for full-sample dimensions; for a selected fluid flow model, performing a calibration so as to match parameters of the selected fluid flow model to the established figures-of-merit and, based on the calibrated fluid flow model, performing at least one simulation of a flow of the fluid through the digital model of a porous rock sample with a fluid additive to provide a predicted enhanced fluid recovery efficiency.

In another aspect thereof the embodiments of this invention provide a computer program product comprised of software instructions on a computer-readable medium. Execution of the software instructions using a computer results in performing operations comprising constructing a digital model of a porous rock sample using input data; establishing for the digital model of a porous rock sample and for a fluid of interest figures-of-merit that are established for full-sample dimensions; for a selected fluid flow model, performing a calibration so as to match parameters of the selected fluid flow model to the established figures-of-merit and, based on the calibrated fluid flow model, performing at least one simulation of a flow of the fluid through the digital model of a porous rock sample with a fluid additive to provide a predicted enhanced fluid recovery efficiency.

In a further non-limiting aspect thereof the embodiments of this invention provide system, comprised of at least one data processor connected with at least one memory that stores software instructions and further connected with a database, where execution of the software instructions by the at least one data processor causes the system to: construct a digital model of a porous rock sample using input data from at least one of sensors and experimental tools, the input data being stored in the database; establish for the digital model of a porous rock sample and for a fluid of interest figures-of-merit that are established for full-sample dimensions; for a selected fluid flow model, perform a calibration so as to match parameters of the selected fluid flow model to the established figures-of-merit and, based on the calibrated fluid flow model, perform at least one simulation of a flow of the fluid through the digital model of a porous rock sample with a fluid additive to provide a predicted enhanced fluid recovery efficiency.

DETAILED DESCRIPTION

Figure 1:
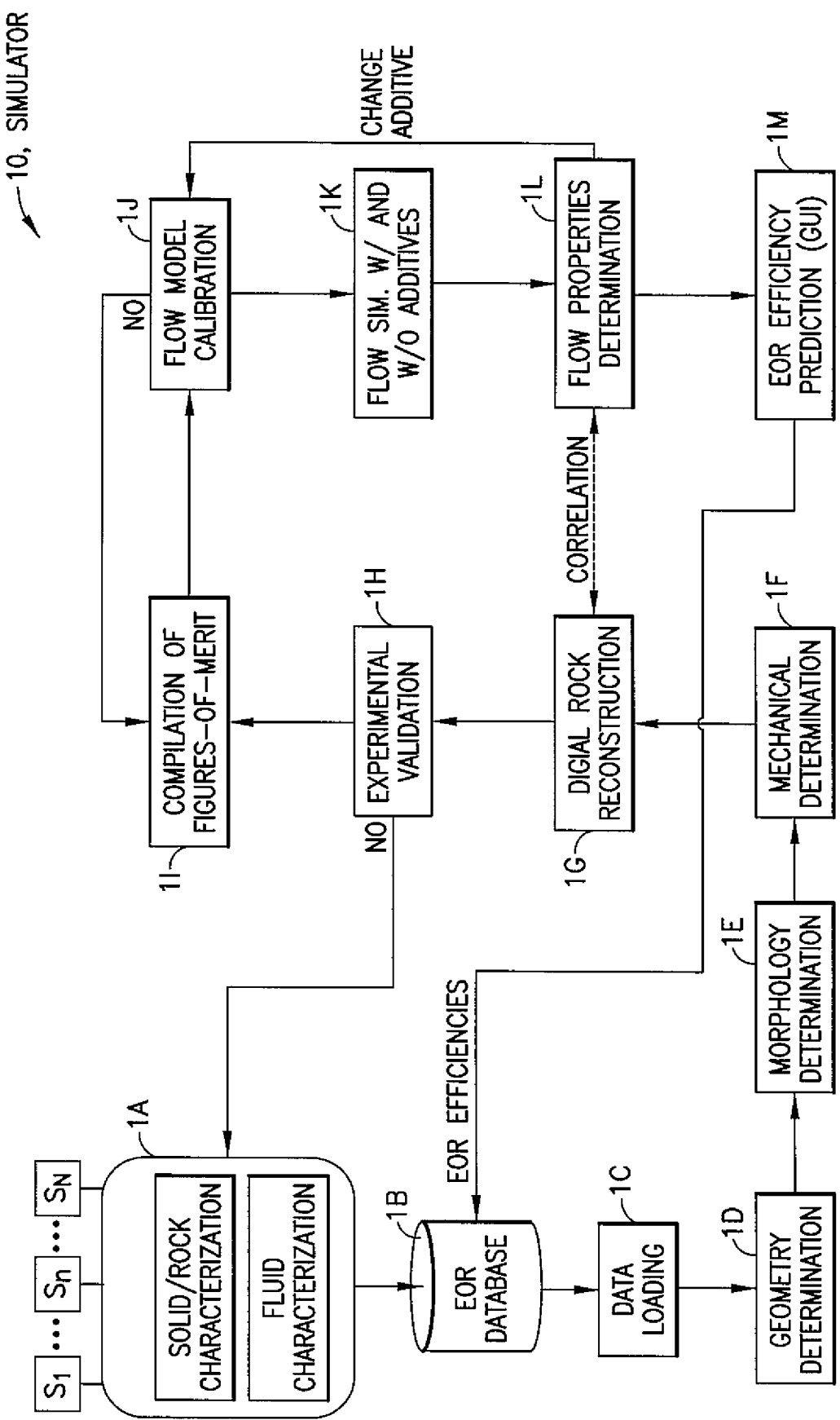
FIG. 1 illustrates a non-limiting example of a simulator and simulation workflow in accordance with embodiments of this invention.

An alphabetically arranged list of abbreviations and associated definitions that occur in the description of the invention is provided below for the convenience of the reader.
DHD direct hydrodynamic
DPD dissipative particle dynamics
DRA digital rock analysis
EOR enhanced oil recovery
FDM finite difference method
FEM finite element method
FVM finite volume method
LBM lattice Boltzmann method
MD molecular dynamics
MPS multi-point statistics
MSPS multiscale percolation system
REV representative elementary model
SPH smoothed particle hydrodynamics As employed herein a voxel can be considered as a 'volume pixel' that is one element of an array of elements of volume.

The word "exemplary" when used herein is intended to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

A number of advantages can be gained by the use of fluid/matrix modeling to better describe fluid flow in a porous media. One such advantage relates to provisioning a testbed that is configured to optimize a selection of oil recovery enhancers such as, for example, chemicals, polymers, nanoparticles, emulsions and gas bubbles.

Relatedly, there has been a trend in modeling to reduce voxel size, in conjunction with improvements in tomographic imaging techniques, to aid a researcher in exploring the nanostructure of pore networks. This can create a demand for a novel DRA approach that takes into account micrometer scale and nanometer scale fluid-fluid and fluid-solid interactions. In general, the larger the surface-to-volume ratio of the pore channels in a porous medium, the more important are the interactions on the overall flow properties in the porous medium.

One conventional approach to DRA and its implementations focuses solely on the geometrical and morphological aspects of a rock structure and the pore network within it, as obtained by tomographic imaging. Image processing and image enhancing algorithms can be used to remove noise, calculate pixel statistics and perform binary segmentation. Morphological algorithms extract properties such as the medial axis skeleton and the connectivity of the pore network. This information is then used to perform fluid flow simulations (geometry) and pore network models (morphology) in order to obtain the transport properties of fluids through that porous medium.

Accounting for the fluid-fluid and fluid-solid interaction and the modifications applied to it when recovery enhancers are added to the system allows for a more accurate physical description of the flow in porous media and enables the realization of simulated trials to determine which recovery enhancement approach provides the optimum EOR efficiency.

At least one conventional visualization and analysis software approach reads 2D/3D images of rock samples, performs image processing, extracts geometrical and morphological information and simulates fluid flow to obtain transport properties such as permeability. However, there is no functionality present to account for the nanoscale surface chemistry and for how the rock interacts with fluids at the nanoscale.

Physical properties of a porous material can be estimated from an imaged sample. The outcome of such methods is a relationship between physical and image properties of a sample, such as porosity-permeability. Such methods may include various steps including image processing and physics-based simulation. Although these methods can present useful techniques when applied to DRA they do not take into account the fluid-solid interactions on the rock surface, instead, they focus on the geometrical and morphological character of the pore network present in the porous material.

The determination of a REV, that is, the smallest volume over which a given rock sample represents a larger volume, is a subject of interest in DRA. Certain rocks, such as carbonates, are highly inhomogeneous and present variability over length scales several orders of magnitude larger than the pore scale. Proposals have been made related to the determination of REVs that involve statistical studies of porosity and surface-to-volume ratio over different length scales. However, these proposals tend to neglect an important aspect of such an analysis that is related to the surface properties of the rock and how the rock, via its surface properties, interacts with fluids.

Methods for upscaling digital rock data are also important since most imaging techniques are generally limited to millimeter-sized samples. The use of MPS to create larger numerical pseudo-cores allows for the propagation of the heterogeneities in the pore scale to a larger scale. Although relevant to the field, the conventional MPS methods do not consider the fluid-solid surface interactions at the pore-scale and, therefore, the quality of the up-scaled property can be severely limited by the crude description of the underlying pore-scale system.

DHD pore flow simulation is offered as part of one commercially available service that includes an experimental counterpart to DRA using scanning electron microscope, focused ion beam, and micro-CT scanners. The simulator is based on a density functional method that uses a continuous description of a multiphase, multicomponent mixture in a unified way by solving the same system of hydrodynamic equations at each spatial point in each bulk fluid phase and inside interfacial regions. However, being based on the continuous approximation approach the simulator does not focus on sub-500 nm phenomena that can, for example, be of particular interest to shale rock reservoirs where most pores have diameters well below this size.

The exemplary embodiments of this invention encompass the use of a system (including sensors, hardware and software) that takes into account the fluid-fluid and fluid-solid interactions at the micrometer/nanometer scale and how these interactions are affected when recovery enhancers such as chemicals, polymers, nanoparticles, emulsions, gas bubbles, etc., are added to the system.

Additional information that can arise from, for example, experiments, simulations, libraries or phenomenology, can be assigned to a tomography voxel so that it better represents the actual (real) physical material that originated it. Appropriate sources for voxel-scale fluid-solid interactions may vary, depending on the voxel size.

One significant and exemplary advantage that is realized by the use of this invention is an ability to capture the non-trivial phenomena that takes place at the fluid-fluid and fluid-solid interfaces in micropores/nanopores of rock, opening the possibility of using the embodiments for performing numerical screenings of EOR materials/compounds.

The embodiments of this invention can consider pore sizes in an exemplary range of about 1 nm to a few μm, and further can beneficially consider sub-500 nm (sub-micron) pore sizes and the fluid-fluid and fluid-solid interactions that can occur in this size regime. The embodiments of the simulator in accordance with this invention beneficially enable a user to screen a set of potential additives for use in the field to enhance oil recovery, without requiring that expensive and time consuming field trials be conducted.

Reference can now be made to FIG. 1 for showing a non-limiting example of a simulator 10 and a simulation process/method workflow in accordance with embodiments of this invention. The blocks $S_I$, $S_n$, $S_N$ are representative of various data sources. These blocks, in addition to the blocks labeled 1A and 1B, may be characterized as being data generation and/or data integration functions. The blocks labeled 1G, 1L and 1M may be characterized as being visualization functions that can use a graphical user interface (GUI) to display results to a user. The remaining blocks 1C-1F and 1H-1K may be characterized as being computational/algorithmic functions.

In general the various blocks of the simulator 10 that are shown in FIG. 1 can be implemented in whole or in part as discrete logic functions/engines, or they can be implemented in whole or in part by program code modules/subroutines/algorithms (computer program code), or they can be implemented as a combination of discrete logic functions/engines and computer program code.

The simulation workflow begins by populating an EOR database 1B from block 1A with physical characterizations of fluids and solids (rocks and dispersed particles). Block 1A receives the outputs of the $S_I$, $S_n$, $S_N$ and supplies these as the physical characterizations of fluids and solids to the EOR database 1B. These physical characterizations can include but are not limited to material data and flow properties data. This data may originate from the array of sources $\{S_n\}$ such as sensors, experimental tools, ab initio simulations, phenomenology and/or libraries. Rock characterization input data to the EOR database 1B provides at least geometrical information on a pore network of interest while the solid characterization input data to the EOR database 1B provides physical information regarding, for example, the wetting, chemistry, material, mechanical, spectroscopical, etc., properties of the solids involved in the simulation (rocks or suspended particles). Fluid characterization input data to the EOR database 1B can be represented as a list of fluid properties such as, but not limited to, density, viscosity, surface tension, line tension, molecular composition, structural factors and/or compressibility. The EOR database 1B is then loaded into the simulator 10 by data loading block 1C and consumed by the simulator 10 in order to begin processing the stored information.

The rock characterization input of block 1A may arise from various experimental and/or simulated sources. A three dimensional (3D) tomographic image, either obtained experimentally or generated numerically from a set of two dimensional (2D) images, can be read by the simulator 10. The 3D tomographic image is comprised of a collection of voxels (volume pixels), each representing a region of the sample of interest at a certain length scale. The voxel size (resolution) determines the scale at which the physics of the fluid-solid interaction should be captured by the simulator 10.

Experimental techniques such as, but not limited to, X-ray computed micro-tomography/nano-tomography, synchrotron computed micro-tomography/nano-tomography, dual-energy computed micro-tomography/nano-tomography, focused ion beam tomography, electron tomography, 3D atom probe, etc., may be used to measure the rock structure and to store the structural geometry in a data file. In computerized tomography the voxels typically hold a gray-scale integer value (from 0 to 255 in 8-bit notation or 0 to 65535 in 16-bit notation) that is representative of the density and atomic number of the sample at that point. Denser regions are associated with the rock itself while lighter regions are associated with the pore space within the rock.

Certain numerical techniques, such as the MPS or the MSPS, can also be used to create 3D pseudo-cores suitable for use in the simulator 10 from a set of 2D images. Techniques for accomplishing this are described in, for example, Zhang et al., U.S. Pat. No. 8,725,477 B2, Hurley et al., U.S. Pat. No. 8,908,925 B2 and Hurley et al., US 20120221306 A1, as well as in Daïan et al., Journal of Petroleum Science and Engineering 42 (2004) 15-28, Fernandes et al., Physical Review E 54, 1734 (1996) and Liang et al., Journal of Petroleum Science and Engineering 21, Issues 3-4, November 1998, Pages 273-283. Such 2D images can be obtained from experimental techniques such as scanning electron microscopy, scanning probe microscopy, atomic force microscopy and laser scanning fluorescence microscopy. Alternatively, any ad hoc 3D porous geometry, such as a close packing of spheres, can also be used as input. In addition, rock input data can be loaded from a library that may be proprietary or open, such as ROCK-ETH Group, www.rockphysics.ethz.ch, Imperial College Department of Earth Science and Engineering, and/or Digital Rock Portal @ University of Texas.

The solid characterization input of block 1A conveys additional physical information such as chemistry, material, mechanics, spectroscopy, etc., other than the purely geometrical information that can be assigned to the solid voxels in order to augment the physical meaning attributed to them. The operation of the simulator 10 can be enhanced by assigning additional information to the voxels such as, but not limited to, chemical composition, molecular termination, free energy, surface charge and philicity or phobicity towards a certain fluid. The solid characterization can be assumed to include as well the characterization of any solid particles that are to be dispersed in the embedding fluids.

The additional physical information of the solid characterization input is preferably representative of the solid properties at the same scale (voxel) as the geometric detail of the rock characterization input of block 1A is provided. Alternatively, if only information from a different scale is present, the required voxel-scale analog can be complemented by interpolation, extrapolation or by additional assumptions and calculations. The possible sources of the additional physical information are many and typically are ultimately defined by the length scale corresponding to the voxel size.

For nanometer-sized voxels it is possible to use either experimental nano science techniques (such as scanning probe or electron microscopy, hyperspectral imaging, confocal laser scanning microscopy, etc.) or atomic-scale or molecular-scale computer simulations (such as atomistic molecular dynamics, coarse-grained molecular dynamics, Monte Carlo, etc.) For micrometer-sized voxels it is possible to use experimental mesoscale techniques (such as profilometry, petrography, optical microscopy, mercury porosimetry, etc.) or mesoscale numerical techniques (such as the LBM, dissipative particle dynamics, smoothed particle dynamics, etc.) as is deemed most appropriate. For example, the LBM (or thermal lattice boltzmann methods (TLBM)) form a class of computational fluid dynamics methods for fluid simulation. Instead of solving Navier-Stokes equations, the discrete Boltzmann equation is solved to simulate the flow of a Newtonian fluid with collision models such as Bhatnagar-Gross-Krook (BGK). By simulating streaming and collision processes across a limited number of particles, the intrinsic particle interactions evince a microcosm of viscous flow behavior applicable across the greater mass.

Alternatively, and for any length scale of interest, it is possible to resort to libraries and published results in the literature to populate the EOR database 1B with the physical properties required as inputs to the simulator 10. In addition, in a case where such additional information is not available an ad hoc value for the required physical property can be assigned to the voxels by the user.

After loading the EOR database 1B the process flow continues to execute blocks 1D, 1E, 1F and 1G of the simulator 10 where the geometrical, morphological and mechanical properties of the rock can be determined by the application of a series of computational algorithms. These processes use both the preloaded and calculated information to enable the digital reconstruction of the rock sample, and its visualization, in a computational environment.

The rock sample geometry determination of block 1D may involve image processing algorithms such as, but not limited to, noise-removal filters, image segmentation, image labeling and pixel statistics as well as 3D visualization of the geometry. The geometry determination of block 1D may also employ data from the solid characterization input of block 1A by correlating, for example, spectroscopy data (material) and tomography data (grayscale level) in order to enhance image segmentation algorithms. One goal of the geometry determination of block 1D is to segment the sample image into first voxels corresponding to "rock" and second voxels corresponding to "pores". A binary segmentation process can be employed in this regard.

Several morphological properties of the pore structure may be calculated during the operation of the morphology determination block 1E. The morphological properties that can be determined by the operation of block 1E in order to better characterize the rock geometry can include, but are not limited to, one or more of surface boundary, surface-to-volume ratio, porosity, pore size distribution, connectivity of the pore network, fractal dimensions of both the connected pore network and its surface, radius of gyration, moment of inertia, two-point correlation function, autocorrelation and autocovariance.

The mechanical determination of block 1F can include the calculation of the mechanical and seismic properties of the rock such as, but not limited to, shear and bulk moduli, formation factor, elasticity, compressional velocity, shear velocity and electrical resistivity, which can also benefit seismic modeling simulators. Significantly, the mechanical determination process of block 1F may also apply reservoir-like conditions of pressure and temperature to deform the rock structure towards its reality in the oil field. As a result the input to the flow simulation can be even more representative of the actual, real rock sample.

The end result of the operations of blocks 1D-1E can be a digital rock reconstruction visualization process performed by block 1G.

Once the digital rock reconstruction processes are completed the result can be validated against known experimental results by the experimental validation block 1H. The experimental validation process of block 1H can include, as non-limiting examples, a comparison of porosity, density, bulk and shear moduli and sound wave speeds to known experimental results.

For example, if the computed porosity of the digital rock sample does not match an experimentally determined porosity that was obtained by mercury porosimetry experiments one may be required to redo the micro-tomography using better spatial resolution and/or signal-to-noise ratios. Conversely, if the computed density does not match the experimental value one may need to recompile the list of constituent minerals and perform multi-level image segmentation to account for different mineral (solid) phases. As such, an iterative path (the No branch from block 1H) can be established and, at each iteration loop, the EOR database 1B can be augmented with additional, improved information that ultimately leads to an acceptable digital rock reconstruction at block 1G that terminates the iterative loop.

After the accuracy checks have been performed and the digital rock reconstruction has been experimentally validated at block 1H, control passes to block 1I where a list of target figures-of-merit is compiled, both for the solid (rock) and fluid physical properties. The values of such properties may, preferentially, be provided either by experiments or by ab initio atomic-scale/molecular-scale calculations, where the property values are preferably sensitive to nanoscale phenomena. An exemplary and non-exhaustive list of target nanoscale-aware figures-of-merit may include one or more of: (a) contact angles or appropriate measures of the rock's wettability with respect to one or more fluids; (b) fluid properties such as, but not limited to, density, viscosity, surface tension, line tension and compressibility; and (c) permeability with respect to single-phase and two-phase flow of simple fluids such as water and/or oil.

Relatedly, a concept of "full-sample dimensions" pertains to a length scale at which the figures-of-merit are defined. The figures-of-merit can be defined at a length scale that corresponds to the entire digital rock sample (for example, a computed micro-tomography scan), hence "full-sample dimensions". Note, however, that certain properties such as, for example, permeability cannot be defined at sub-micron scales. The figures-of-merit, although defined for "full-sample dimensions", can be highly sensitive to nanoscale phenomena, and it is in this sense that the model can be calibrated. In this case then it is desirable to tune the nanoscale interactions and observe their effect upon larger length scale properties such as, for example, the permeability of the entire porous rock sample.

After the list of figures-of-merit is compiled at block 1I the operation of the simulator 10 progresses to blocks 1J, 1K and 1L. It can be noted that recursions are possible between certain of these blocks, in particular between the flow model calibration block 1J and the figures-of-merit compilation block 1I, and between the flow properties determination block 1L and the flow model calibration block 1J (the line labeled "change additive").

Basically the portion of the simulator 10 represented by the blocks 1J, 1K and 1L involves the use of computational fluid dynamics algorithms such as, but not limited to, physics-based flow models including, for example, (coarse-grained) MD, DPD, LBM, SPH, FVM, FEM and/or FDM. Phenomenological methods can also be employed such as an electrical-analog pore network model. The geometrical and morphological data derived in blocks 1D, 1E (and 1F) may also be used as input to the fluid dynamics simulations. An appropriate mesh, lattice, network or another suitable (computational) spatial representation of the rock is created and local physical properties are assigned.

Regardless of the selected flow model, the flow model calibration block 1J is operated to tune the (often unphysical) flow model parameters so that the nanoscale-aware figures-of-merit determined and enumerated at block 1I are matched as closely as possible. As was noted above, one exemplary figure-of-merit might be, for example, the water-oil contact angle on a given surface. In this non-limiting case:

(a) in LBM it may be desirable to tune the constants of multi-phase Shan-Chen or Free-Energy models (e.g., Huang et al., Physical Review E 76, 066701 (2007); Schmieschek et al., Communications in Computational Physics 9 (2011), 1165-1178);

(b) in SPH it may be desirable to tune the particle-particle force parameters (e.g., Tartakovsky et al., Physical Review E 72, 026301 (2005); Das et al., Chemical Engineering Science 65, Issue 13, July 2010, Pages 4027-4037; Liu et al., International Journal of Computational Methods 08, 637 (2011)); while (c) in DPD it may be desirable to tune the strength of the attraction and repulsive force terms (e.g., Liu et al., International Journal of Computational Methods 08, 637 (2011); Henrich et al., Europhysics Letters 80, 60004 (2007); Lin et al., Interaction and Multiscale Mechanics, Vol. 5, No. 4 (2012) 399-405).

Note that certain additives such as, but not limited to, chemicals, polymers, nanoparticles, emulsions and gas bubbles can have an effect of changing the contact angle of an oil droplet on the rock surface thereby leading to a lower wettability and a higher oil recovery rate. Such a modification to the figure-of-merit (contact angle) is also preferably captured by the flow model calibration block 1J.

When all of the model parameters are calibrated with respect to their respective target figures-of-merit, the flow model is ready to provide predictive results. The iterative loop represented by the change additive arrow between the flow properties determination block 1L and the flow model calibration block 1J can be implemented simply by taking available candidate additives from a predefined list of additives, or by using an additive design methodology that tailors and optimizes the additive to maximize EOR efficiency.

The flow simulation with (and without) additives block 1K employs one or more computational fluid dynamics simulation methods in order to obtain the expected fluid transport properties of the rock sample of interest. A final goal of this process is the determination of flow properties at block 1L. The flow properties can contain three-dimensional fields (scalar, vector or tensor) representing spatially-dependent physical data in the rock sample such as, but not limited to, flow velocity, pressure and density, as well as overall physical properties (scalar, vector or tensor) that quantitatively characterize the fluid flow and the oil recovery in the porous rock sample such as, but not limited to, absolute and relative permeability tensors, oil sweep efficiency and capillary pressure.

The arrow labeled "correlation" between the digital rock reconstruction visualization process of block 1G and the flow properties determination process of block 1L indicates an ability to verify that the determined flow properties are compatible with the previously determined geometrical, morphological and mechanical properties of the rock.

Figure 2:
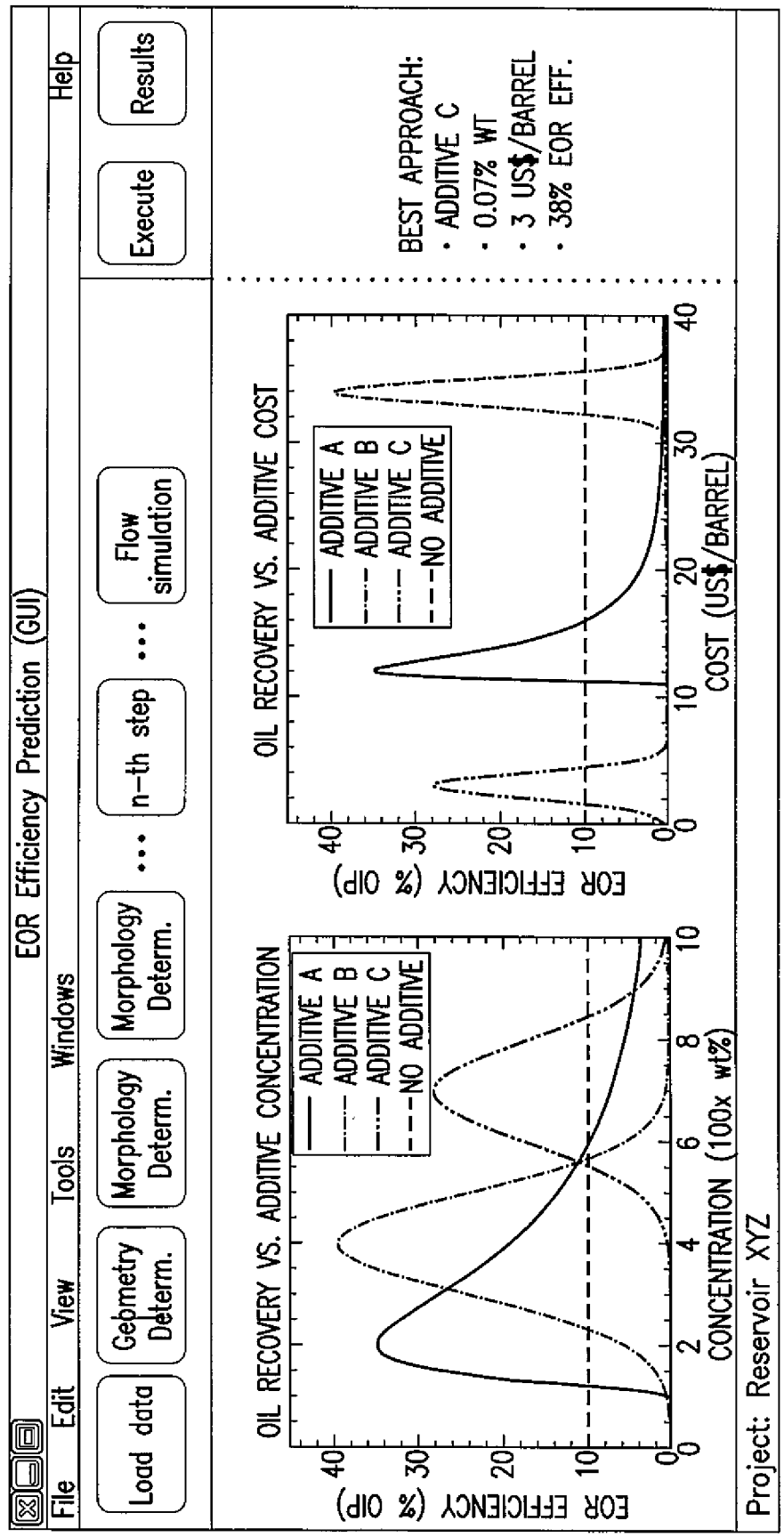
FIG. 2 depicts an example of a graphical user interface presentation to a user of the simulator shown in FIG. 1.

The EOR efficiency prediction block 1M can be implemented as a visualization process using a GUI, an example output of which is shown in FIG. 2 for three selected additives (A, B and C) and with no additive. This process of the simulator 10 enables a quantification to be made of the effect of an additive or additives on the flow properties. Once all candidate additives have been tested, their EOR efficiency with respect to, for example, a simple water-flooding (without additives) and to one another can be quantified and ranked, allowing for the selection of the best candidate EOR approach, while considering also, for example, cost-effectiveness criteria. The GUI can be useful to display the simulator 10 results for different candidate EOR additives to aid in determining an optimum EOR approach. In the illustrated example three additives (and no additive) are characterized for EOR efficiency vs. concentration and for EOR efficiency vs. cost and additive C is shown to provide the best approach.

The various buttons displayed on the GUI can be used to initiate the various simulator blocks/processes (e.g., load data 1C, geometry determination 1D, morphology determination 1E, etc.) as described above with reference to FIG. 1.

An output from the EOR efficiency prediction block 1M, representing a result of the simulation workflow including EOR efficiencies for each tested additive and other information, can be fed back to the EOR database 1B. By augmenting the EOR database 1B with the information descriptive of EOR efficiency it becomes possible to build a knowledge base that can be later accessed by, as one non-limiting example, a cognitive processing system for providing insights into EOR strategies. The EOR database 1B can contain, for example, both structured and unstructured data related to the inputs and outputs of all system processes, as well as external information (with respect to the system) that can, however, be correlated to the system data. Non-limiting examples of such data can include bulk scalar (porosity), vector (average flow velocity vector) or tensor (permeability) variables, spatially-dependent scalar (density), vector (flow velocity) or tensor (stiffness) fields as well as images (graphs), texts (reports) and various tables of interest (e.g., cost of additives).

Figure 3:
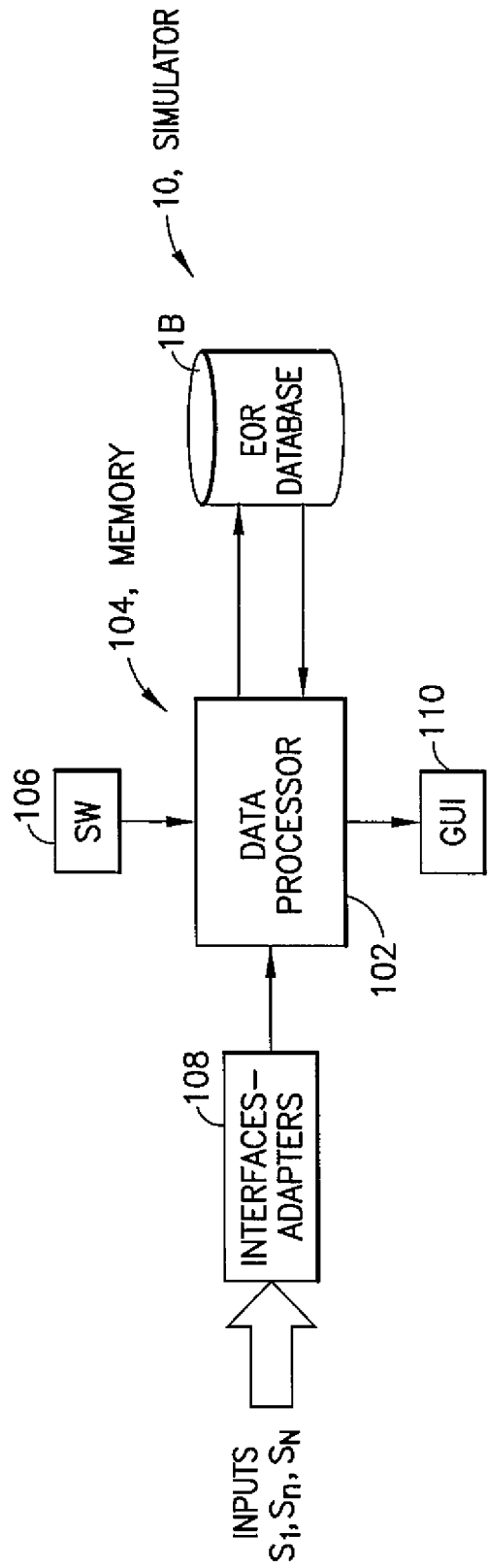
FIG. 3 is an example of a block diagram of the simulator shown in FIG. 1.

FIG. 3 is an example of a block diagram of the simulator 10 shown in FIG. 1. The simulator 10 includes at least one controller/data processor 102 connected with at least one memory 104 that stores software (SW) 106. The software 106 can include those programs that are desirable to run to perform the determinations of the geometrical, morphological and mechanical properties of the rock (blocks 1D-1F), the digital rock reconstruction visualization process of block 1G, the experimental validation operation of block 1H, the compilation of the list of figures-of-merit of block 1I, the flow model calibration of block 1J, the flow simulation of block 1K, the flow properties determination of block 1L and the EOR efficiency prediction performed by block 1M. Bi-directionally connected with the at least one controller/data processor 102 is the EOR database 1B. The data processor 102 is also connected with interfaces/adapters 108 that are configured to receive data from the various source inputs $S_l$, $S_n$, $S_N$. Also connected with the at least one controller/data processor 102 is at least one display device/GUI 110 that implements at least in part the various simulation visualization operations (e.g., blocks 1G, 1L) as well as the EOR efficiency prediction block 1M.

In general the various components and sub-systems shown in FIG. 3 can be implemented in whole or in part as circuitry and/or as separate special purpose data processor/controllers and/or as the software 112.

The simulator 10 can be physically instantiated in whole or in part as one or more computers and computing systems at an enterprise, such as at a natural resources exploration/recovery enterprise, or it could be, for example, instantiated at an agency or an academic institution, or it can be instantiated in whole or in part in a virtual manner in the cloud. In some embodiments the use of the simulator 10 can be provided as a service to researchers and others via data communication networks including the Internet.

In whatever physical/virtual form the simulator 10 is instantiated it can be assumed to include certain cooperating functionality that is responsive to the input source/sensor data (source inputs $S_l$, $S_n$, $S_N$), as well as to the other input and/or calculated data stored in the EOR database 1B, to execute whatever modeling/simulation programs that are selected by the user at least for the purpose of determining optimum additives and corresponding EOR efficiencies for some natural resource-containing reservoir(s). This cooperative functionality can include, in addition to the EOR database 1B, some or all of the various blocks 1A and 1C-1M which can be realized as physical components/circuitry and/or as executable program code modules and partitions.

The present invention may be a system, a method, and/or a computer program product. The computer program product may include a computer readable storage medium (or media) having computer readable program instructions thereon for causing a processor to carry out aspects of the present invention.

Figure 4:
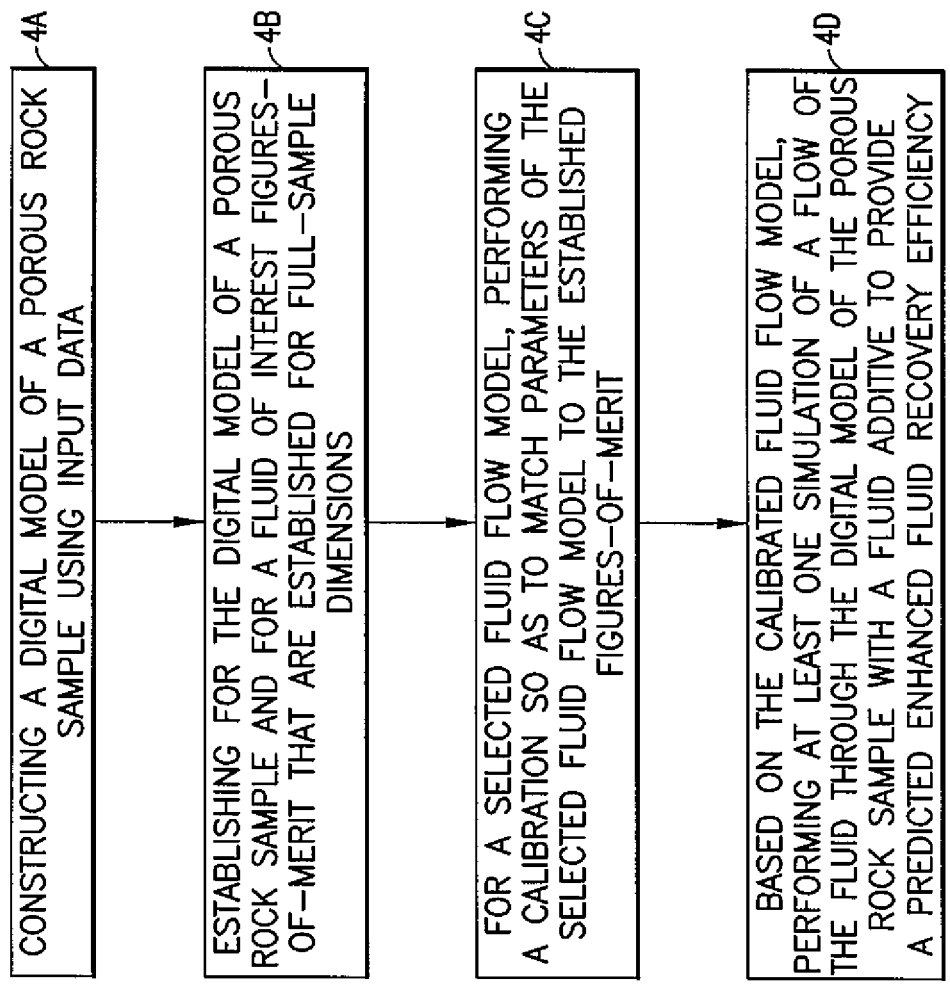
FIG. 4 is a logic flow diagram that shows an embodiment of a method in accordance with the embodiments of this invention.

For example, FIG. 4 is a logic flow diagram that shows an embodiment of a method and process flow in accordance with the embodiments of this invention. At block 4A there is a step of constructing a digital model of a porous rock sample using input data obtained from sensors and/or experimental tools. At block 4B there is a step of establishing for the digital model of a porous rock sample and for a fluid of interest figures-of-merit that are established for full-sample dimensions. At block 4C there is a step of, for a selected fluid flow model, performing a calibration so as to match parameters of the selected fluid flow model to the established figures-of-merit. At block 4D there is a step of, based on the calibrated fluid flow model, performing at least one simulation of a flow of the fluid through the digital model of a porous rock sample with a fluid additive to provide a predicted enhanced fluid recovery efficiency.

In the method and process flow in accordance with the embodiments of this invention depicted in FIG. 4, the input data can be comprised of geometrical information on a pore network of the porous rock sample and physical information descriptive of at least the wetting, chemistry and material properties of the porous rock sample. The wetting properties of the rock sample can comprise a contact angle of the fluid on a surface of the porous rock sample, and the input data can be further comprised of fluid characterization data comprising fluid properties.

In the method and process flow in accordance with the embodiments of this invention depicted in FIG. 4, the step/operation of constructing the digital model of the porous rock sample can comprise performing a geometry determination, a morphology determination and a mechanical determination using the input data.

In the method and process flow in accordance with the embodiments of this invention depicted in FIG. 4, the step/operation of establishing the figures-of-merit can comprise an initial step/operation of comparing the constructed digital model of the porous rock sample to experimental results, and iterating the construction of the digital model until the digital model is in agreement with the experimental results.

In the method and process flow in accordance with the embodiments of this invention depicted in FIG. 4, the figures-of-merit can comprise at least one of a measure of the wettability of the porous rock sample with respect to one or more fluids; fluid properties; and permeability of the porous rock sample with respect to single-phase and two-phase fluid flow.

In the method and process flow in accordance with the embodiments of this invention depicted in FIG. 4, the calibration and the flow simulation steps/operations can be repetitively performed with different fluid additives so as to determine a best predicted enhanced fluid recovery efficiency.

In the method and process flow in accordance with the embodiments of this invention depicted in FIG. 4, the method/process flow can also comprise storing the predicted enhanced fluid recovery efficiency in a database in association with the input data.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A method, comprising:
   constructing a digital model of a porous rock sample using input data;
   establishing for the digital model of a porous rock sample and for a fluid of interest figures-of-merit or full-sample dimensions, wherein the figures-of-merit and full-sample dimensions are comprised of property values based on nanoscale phenomena;
   for a selected fluid flow model, performing a calibration so as to match parameters of the selected fluid flow model to the established nanoscale-based figures-of-merit; and
   based on the calibrated fluid flow model, performing at least one simulation of a flow of the fluid through the digital model of the porous rock sample with a fluid additive to provide a predicted enhanced fluid recovery efficiency.

2. The method as in claim 1, where the input data is comprised of geometrical information on a pore network of the porous rock sample and physical information descriptive of at least the wetting, chemistry and material properties of the porous rock sample, and wherein the property values of the figures-of-merit and full-sample dimensions are provided by atomic-scale and molecular-scale calculations, the atomic-scale and molecular-scale calculations being impacted by nanoscale phenomena.

3. The method of claim 2, where the wetting properties of the porous rock sample comprise a contact angle of the fluid on a surface of the porous rock sample, and where the input data is further comprised of fluid characterization data comprising fluid properties.

4. The method of claim 1, where constructing the digital model of porous rock comprises performing a geometry determination, a morphology determination and a mechanical determination using the input data.

5. The method of claim 1, where establishing the figures-of-merit comprises an initial step of comparing the constructed digital model of the porous rock sample to experimental results and iterating the construction of the digital model until the digital model is in agreement with the experimental results.

6. The method of claim 1, where the figures-of-merit comprise at least one of a measure of the wettability of the porous rock sample with respect to one or more fluids; fluid properties; and permeability of the porous rock sample with respect to single-phase and two-phase fluid flow.

7. The method of claim 1, where the calibration and the flow simulation are repetitively performed with different fluid additives so as to determine a best predicted enhanced fluid recovery efficiency.

8. The method of claim 1, further comprising storing the predicted enhanced fluid recovery efficiency in a database in association with the input data.

9. A computer program product comprised of software instructions on a non-transitory computer-readable medium, where execution of the software instructions using a computer results in performing operations comprising:
   constructing a digital model of a porous rock sample using input data;
   establishing for the digital model of a porous rock sample and for a fluid of interest figures-of-merit for full-sample dimensions, wherein the figures-of-merit and full-sample dimensions are comprised of property values based on nanoscale phenomena;
   for a selected fluid flow model, performing a calibration so as to match parameters of the selected fluid flow model to the established nanoscale-based figures-of-merit; and
   based on the calibrated fluid flow model, performing at least one simulation of a flow of the fluid through the digital model of the porous rock sample with a fluid additive to provide a predicted enhanced fluid recovery efficiency.

10. The computer program product of claim 9, where the input data is comprised of geometrical information on a pore network of the porous rock sample, fluid characterization data and physical information descriptive of at least the wetting, chemistry and material properties of the porous rock sample, where the wetting properties of the rock comprise a contact angle of the fluid on a surface of the porous rock sample, and wherein the property values of the figures-of-merit and full-sample dimensions are provided by atomic-scale and molecular-scale calculations, the atomic-scale and molecular-scale calculations being impacted by nanoscale phenomena.

11. The computer program product of claim 9, where the operation of constructing the digital model of the porous rock sample comprises performing a geometry determination, a morphology determination and a mechanical determination using the input data.

12. The computer program product of claim 9, where the operation of establishing the figures-of-merit comprises an initial operation of comparing the constructed digital model of the porous rock sample to experimental results and iterating the construction of the digital model until the digital model is in agreement with the experimental results.

13. The computer program product of claim 9, where the figures-of-merit comprise at least one of a measure of the wettability of the porous rock sample with respect to one or more fluids; fluid properties; and permeability of the porous rock sample with respect to single-phase and two-phase fluid flow.

14. The computer program product of claim 9, where the operations of calibration and flow simulation are repetitively performed with different fluid additives so as to determine a best predicted enhanced fluid recovery efficiency.

15. The computer program product of claim 9, further comprising an operation of storing the predicted enhanced fluid recovery efficiency in a database in association with the input data.

16. A system comprised of at least one data processor connected with at least one non-transitory memory that stores software instructions and further connected with a database, where execution of the software instructions by the at least one data processor causes the system to:

construct a digital model of a porous rock sample using input data from at least one of sensors and experimental tools, the input data being stored in the database;

establish for the digital model of a porous rock sample and for a fluid of interest figures-of-merit for full-sample dimensions, wherein the figures-of-merit and full-sample dimensions are comprised of property values based on nanoscale phenomena;

for a selected fluid flow model, perform a calibration so as to match parameters of the selected fluid flow model to the established nanoscale-based figures-of-merit; and based on the calibrated fluid flow model, perform at least one simulation of a flow of the fluid through the digital model of the porous rock sample with a fluid additive to provide a predicted enhanced fluid recovery efficiency.

17. The system of claim 16, where the input data is comprised of geometrical information on a pore network of the porous rock sample, fluid characterization data and physical information descriptive of at least the wetting, chemistry and material properties of the porous rock sample, where the wetting properties of the porous rock sample comprise a contact angle of the fluid on a surface of the porous rock sample, and wherein the property values of the figures-of-merit and full-sample dimensions are provided by atomic-scale and molecular-scale calculations, the atomic-scale and molecular-scale calculations being impacted by nanoscale phenomena.

18. The system of claim 16, where the digital model of the porous rock sample is constructed with a geometry determination, a morphology determination and a mechanical determination using the input data, and where the system further compares the constructed digital model of the porous rock sample to experimental results and iterates the construction of the digital model until the digital model is in agreement with the experimental results.

19. The system of claim 16, where the figures-of-merit comprise at least one of a measure of the wettability of the porous rock sample with respect to one or more fluids; fluid properties; and permeability of the porous rock sample with respect to single-phase and two-phase fluid flow.

20. The system of claim 16, where the system operates to perform the calibration and the flow simulation repetitively with different fluid additives so as to determine a best predicted enhanced fluid recovery efficiency.

* * * * *